(12) United States Patent
Takahashi

(10) Patent No.: US 6,495,766 B2
(45) Date of Patent: Dec. 17, 2002

(54) APPARATUS AND METHOD FOR INSERTING FILTER INTO GROOVE

(75) Inventor: Hiromi Takahashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 21 days.

(21) Appl. No.: 09/774,643

(22) Filed: Feb. 1, 2001

(65) Prior Publication Data

US 2002/0003235 A1 Jan. 10, 2002

(30) Foreign Application Priority Data

Jul. 4, 2000 (JP) ........................................ 2000-201686

(51) Int. Cl.[7] .............................................. H01B 17/00
(52) U.S. Cl. ...................... 174/138 R; 385/52; 385/65; 385/83
(58) Field of Search .............................. 385/52, 65, 83; 174/138 R

(56) References Cited

U.S. PATENT DOCUMENTS 5,712,940 A * 1/1998 Van Roemburg et al. ..... 385/33
5,764,826 A * 6/1998 Kuhara et al. ......... 250/227.11
6,344,148 B1 * 2/2002 Park et al. ...................... 216/2

OTHER PUBLICATIONS

"Automatic Machine for Loading Filter Film to Planar Lightwave Circuit." Ishigami et al., Institute of Electronics, Information and Communication Engineers (IEICE), 1998, p. 330, (No month).

* cited by examiner

Primary Examiner—Dean A. Reichard
Assistant Examiner—Jinhee J Lee
(74) Attorney, Agent, or Firm—Venable, Baetjer Howard & Civilietti, LLP; Michael A. Sartori

(57) ABSTRACT

An apparatus has a head portion for holding a strip of filter, and a support portion for supporting the head portion. The head portion has a guide portion for guiding the filter, a pair of plate members disposed on both sides of the guide portion, with a space left between tips of the plate members and with vicinities of the tips provided at a given angle, and a pair of blades disposed on the tips of the plate members. When the head portion is pressed against a V-shaped channel by the support portion, elastic deformation occurs in the pair of plate members, narrowing the space between the edges of the pair of blades. When the head portion is moved off the V-shaped channel, the space between the edges of the pair of blades expands to an original width.

6 Claims, 4 Drawing Sheets

APPARATUS AND METHOD FOR INSERTING FILTER INTO GROOVE

BACKGROUND OF THE INVENTION

The present invention relates to an apparatus and a method for inserting a filter into a groove formed in a substrate such as a groove crossing a waveguide of a planar lightwave circuit (PLC).

A conventional method for inserting a filter into a groove can be found in the paper titled "Automatic Machine for Loading Filter Film to Planar Lightwave Circuit", presented in 1998 by Ishigami et al., on Electronics 1, page 330 in general conference papers of the Institute of Electronics, Information and Communication Engineers (IEICE) of Japan. In this method, the position of a groove is determined on the basis of the image data obtained by reading markers provided on the PLC by a camera, a laser measuring machine is used to determine the position of the filter to be inserted into the groove, the filter is moved to an optimum position according to the position information, and the filter is inserted into the groove.

The conventional method described above, however, requires a camera for reading markers and a laser measuring machine for measuring the film position, and the whole apparatus used to insert a filter would become expensive, resulting in a rise in the cost of the PLC module to be fabricated. In addition, because it takes much time to read the markers and to measure the filter position, it would take much time to insert the filter into the groove.

SUMMARY OF THE INVENTION

It is an object of the present invention to provide an apparatus and a method for inserting a filter into a groove formed in a substrate that make it possible to insert the filter into the groove quickly through simple operations.

According to the present invention an apparatus for inserting a filter into a groove formed in a substrate, comprises a head portion which holds a strip of filter; and a support portion which supports the head portion. The head portion includes a guide portion which has an outlet through which the filter is fed, and which guides the filter toward the outlet; a pair of plate members which are disposed on both sides of the guide portion to surround the guide portion, with a space left between tips of the plate members and with vicinities of the tips provided at a given angle; and a pair of blades which are disposed on the tips of the plate members, edges of the blades facing each other with a space wider than thickness of the filter. The apparatus is configured in such a manner that when the head portion is pressed against a V-shaped channel comprising a pair of inclined surfaces by the support portion, with the vicinities of the tips of the plate members in face-contact with the inclined surfaces of the V-shaped channel, elastic deformation occurs in the pair of plate members, narrowing the space between the edges of the pair of blades, and when the head portion is moved off the V-shaped channel, the space between the edges of the pair of blades expands to an original width.

The support portion may comprise a pair of arms which are disposed on both sides of the head portion; a supporting bar which is attached to the arms and supports the head portion so that the head portion can be moved in a direction orthogonal to a feeding direction of the filter; and a pair of springs which are disposed on the pair of arms, each spring applying a force to press each face of the head portion facing the arm.

The apparatus may further comprise a thrust bar which supports the support portion in such a manner that the support portion can be rotated about an axis passing a center of the head portion and extending in the feeding direction of the filter; and a thrusting spring which transfers to the support portion a force applied to the thrust bar in the feeding direction of the filter.

The head portion may comprise a pair of rollers which move the filter toward the outlet; and a driving mechanism for driving the pair of rollers.

The head portion may comprise a path of incoming light which extends at an angle with respect to a surface of the filter and reaches the guide portion; a light emitting element which emits light to the filter through the path of incoming light; a path of reflected light which extends at an angle with respect to the surface of the filter and reaches the guide portion; and a light receiving element for receiving the light which is emitted from the light emitting element and reflected from the filter and passes through the path of reflected light.

According to another aspect of the present invention, a method for inserting a filter into a groove formed in a substrate uses a filter insertion apparatus, which comprises a head portion which holds a strip of filter and a support portion which supports the head portion, the head portion including a guide portion which has an outlet through which the filter is fed and which guides the filter toward the outlet, a pair of plate members which are disposed on both sides of the guide portion to surround the guide portion, with a space left between tips of the plate members and with vicinities of the tips provided at a given angle, and a pair of blades which are disposed on the tips of the plate members, edges of the blades facing each other with a space wider than thickness of the filter. The method comprises the steps of putting a guide member onto a substrate of optical circuit having an optical waveguide; forming a V-shaped channel in the guide member; forming a filter insertion groove directly below the V-shaped channel in the substrate of optical circuit; putting out the filter by a given length from the outlet of the guide portion of the apparatus; inserting the filter put out of the outlet of the guide portion into the filter insertion groove by pressing the apparatus toward the V-shaped channel of the guide member, with vicinities of the tips of the plate members of the apparatus in face-contact with inclined surfaces of the V-shaped channel in the guide member, narrowing space between edges of the pair of blades to cut the filter coming out of the outlet of the guide portion by pressing the apparatus further toward the V-shaped channel in the guide member; and moving the head portion off the V-shaped channel in the guide member.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 4A and 4B show the step of sticking a guide member in the method in accordance with this embodiment, wherein FIG. 4A shows a plan view and FIG. 4B shows a side view;

DETAILED DESCRIPTION OF THE INVENTION

Further scope of applicability of the present invention will become apparent from the detailed description given hereinafter. However, it should be understood that the detailed description and specific examples, while indicating preferred embodiments of the invention, are given by way of illustration only, since various changes and modifications will become apparent to those skilled in the art from the detailed description.

Figure 1:
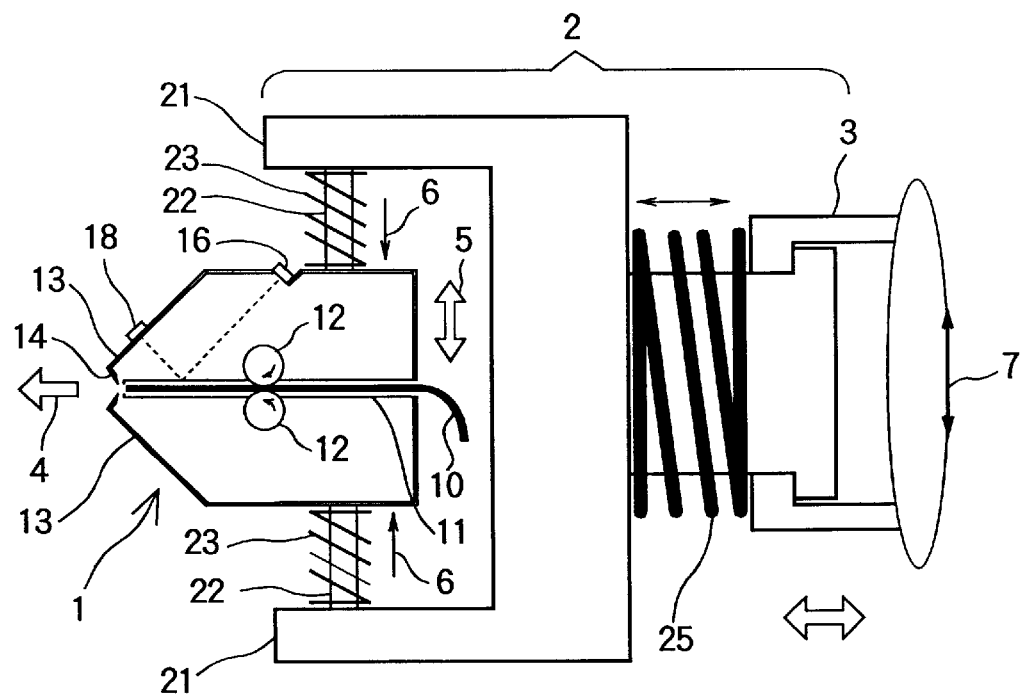
FIG. 1 is a schematic view of the configuration of an apparatus for inserting a filter into a groove, which is used in a method for inserting a filter into a groove, in accordance with an embodiment of the present invention.
Figure 2:
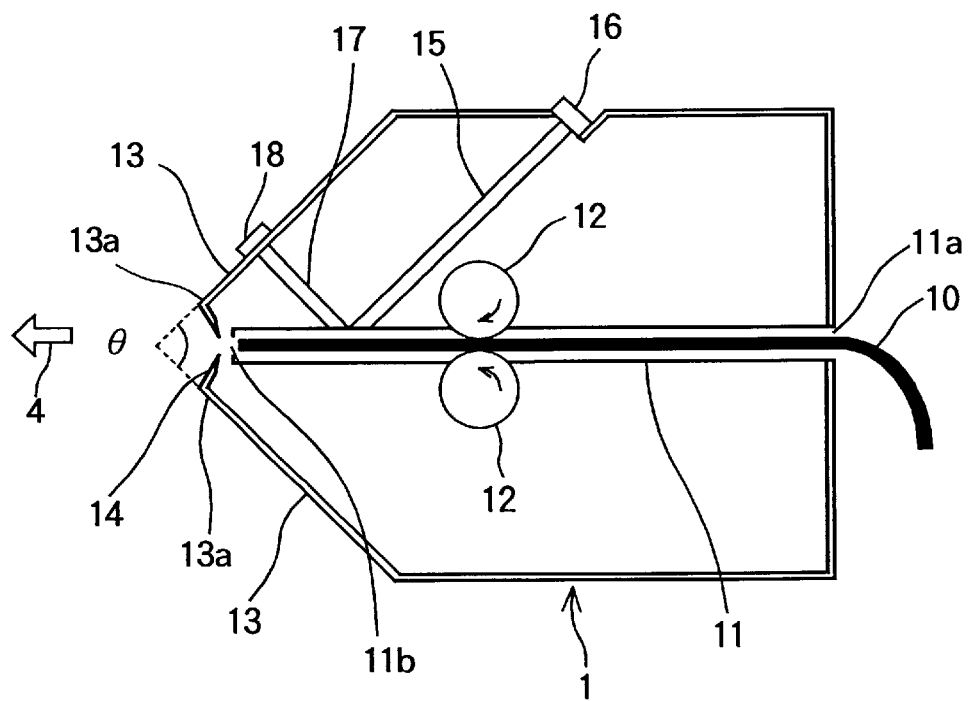
FIG. 2 is an enlarged view of a head portion of the apparatus of FIG. 1.
Figure 3A:
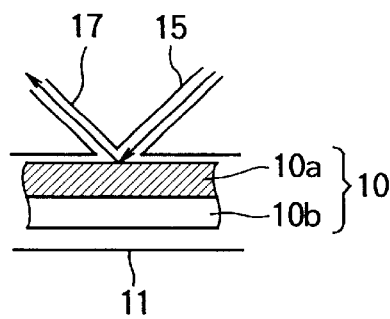
FIGS. 3A and 3B show the principle of detecting the orientation of the filter surface in the apparatus of FIG. 1.
Figure 3B:
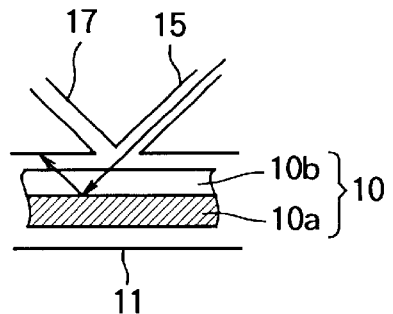

FIG. 1 is a schematic view of the configuration of an apparatus for inserting a filter into a groove, which is used in a method for inserting a filter into a groove, in accordance with an embodiment of the present invention. FIG. 2 is an enlarged view showing a head portion of the apparatus shown in FIG. 1. FIGS. 3A and 3B show the principle of detecting the orientation of the filter surface in the apparatus of this embodiment.

As shown in FIG. 1, the apparatus in accordance with this embodiment has a head portion 1 which holds a strip of filter 10 and a support portion 2 which supports the head portion 1. The filter 10 is a dielectric multi-layer filter, for instance. However, the apparatus of the present invention can also be used as an apparatus for inserting another type of a thin film such as a semitransparent film made from a thin layer of metal.

As shown in FIG. 2, the head portion 1 has a guide portion 11 provided with an inlet 11a and an outlet 11b. The guide portion 11 guides the filter 10 from the inlet 11a toward the outlet 11b. The guide portion 11 has a pair of walls facing each other with the spacing about 1 $\mu$m to 2 $\mu$m wider than the thickness of the filter 10. Moreover, the head portion 1 has a pair of rollers 12 that move the filter 10 in the guide portion 11 toward the outlet 11b (that is, in a feeding direction 4 of the filter 10) and a drive mechanism (not shown) which rotates the rollers 12. The drive mechanism has a motor, a gear mechanism, and the like, for instance.

As shown in FIG. 2, the head portion 1 also has a pair of plate members 13 which are disposed on both sides of the guide portion 11 and surround the guide portion 11. The tips 13a of the plate members 13 are disposed with a space in between, and vicinities of the tips of the plate members 13 are at a given angle θ. The angle θ substantially equals the angle formed by a pair of inclined surfaces of a V-shaped channel (a reference numeral 36 in FIG. 6), which will be described later. Moreover, at least the vicinities of the tips of the plate members 13 are made of elastic materials (metal, for instance). If a pressure is applied to the plate members 13 from the outside, elastic deformation occurs in the plate members 13, narrowing the space between the tips 13a. If the external pressure is removed, the deformation in the plate members 13 is resolved by the elastic restoration action, widening the space between the tips 13a of the plate members 13 to the original width.

In addition, the head portion 1 has a pair of blades 14 fitted to the individual tips 13a of the plate members 13, as shown in FIG. 2. The blades 14 face each other with the space wider than the thickness of the filter 10 in between. The individual blades 14 have sharp cutting edges, and when an external force is applied to the plate members 13 to narrow the space between the tips 13a, the cutting edges of the blades 14 approach each other and come into contact.

As shown in FIG. 2, the head portion 1 further comprises a path 15 of incoming light which extends in a direction at an angle with respect to the surface of the filter 10 in the guide portion 11 and reaches the guide portion 11, a laser diode 16 which emits light (light with a wavelength of 1.55 $\mu$m, for instance) to the filter 10 through the path 15 of incoming light, a path 17 of reflected light which extends in a direction at an angle with respect to the surface of the filter 10 in the guide portion 11 and reaches the guide portion 11, and a photodiode 18 which receives light that is emitted from the laser diode 16 and reflected from the filter 10 and passes the path 17 of reflected light. The filter 10 consists of a substrate 10a which reflects light and a dielectric multi-layer film 10b which allows light to pass through, as shown in FIGS. 3A and 3B. If the substrate 10a is on the side of the path 15 of incoming light, as shown in FIG. 3A, the reflected light enters the photodiode 18 through the path 17 of reflected light. On the other hand, if the dielectric multi-layer film 10b is on the side of the path 15 of incoming light, as shown in FIG. 3B, light passes through the dielectric multi-layer film 10b and is reflected by the substrate 10a, but the reflected light does not enter the path 17 of reflected light and consequently does not enter the photodiode 18. Because the strength of light detected by the photodiode 18 depends on the orientation of the surface of the filter 10, as described above, the orientation of the surface of the filter 10 can be detected on the basis of the output of the photodiode 18.

The support portion 2 has a pair of arms 21 which surrounds both sides of the head portion 1, supporting bars 22 which are disposed on the arms 21 and support the head portion 1 in such a manner that it can move in the direction 5 orthogonal to the feeding direction 4 of the filter 10, and a pair of springs 23 which applies a force pressing the head portion 1 from both sides in directions 6 along the longitudinal direction of the supporting bar 22. This configuration allows the head portion 1 to move along the direction 5 shown in FIG. 1.

The apparatus of this embodiment further comprises a thrust bar 3 which supports the support portion 2 in such a manner that it can be rotated about the axis (horizontal line (not shown) in FIG. 1) passing through the center (not shown) of the head portion 1 and extending in the feeding direction 4 of the filter 10 (in the direction 7 shown in FIG. 1) and a thrusting spring 25 which transfers the force of the thrust bar 3 in the feeding direction 4 of the filter 10 to the support portion 2, as shown in FIG. 1. Because the support portion 2 is rotatably supported by the thrust bar 3, if the surfaces of the filter 10 inserted in the guide portion 11 are upside down, the surfaces of the filter 10 can be turned not by re-inserting the filter 10 but by turning the support portion 2 by 180° with respect to the thrust bar 3.

Figure 4A:
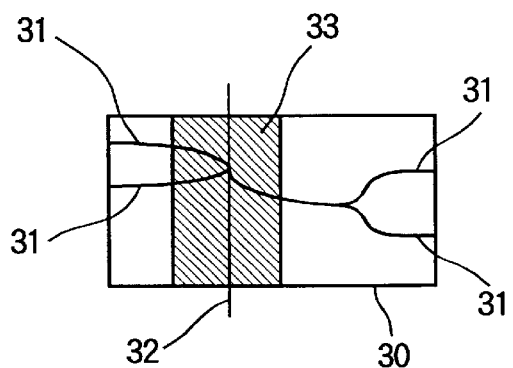
Figure 4B:
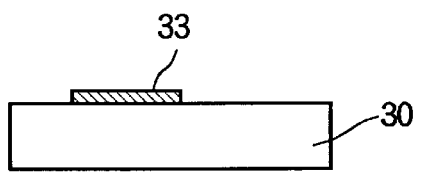
Figure 5:
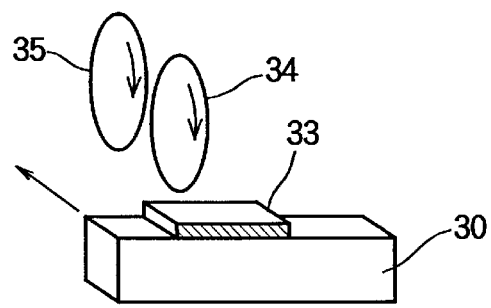
FIG. 5 is a perspective view showing the step of forming a groove in the method in accordance with this embodiment.
Figure 6:
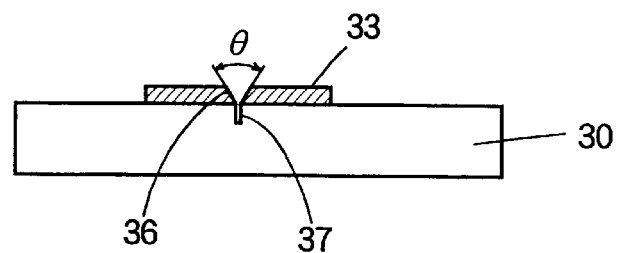
FIG. 6 shows a side view of the substrate obtained by the groove forming step shown in FIG. 5.
Figure 7:
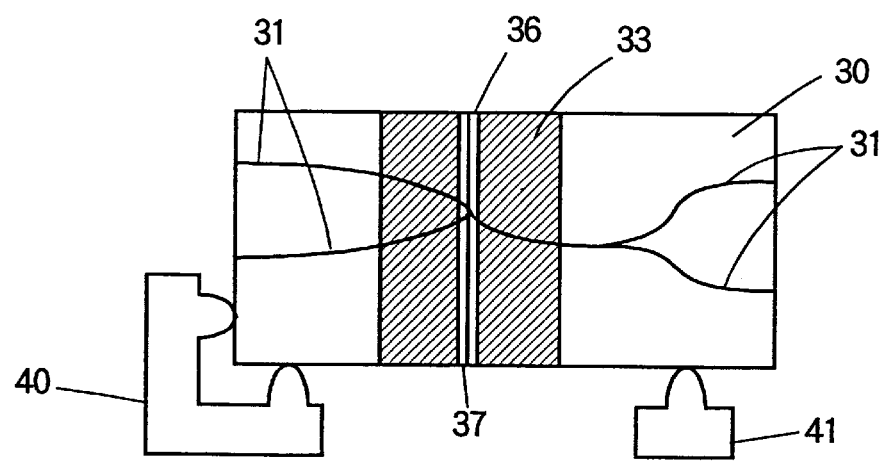
FIG. 7 is a plan view showing the step of positioning the substrate in the method in accordance with this embodiment.

A filter insertion method utilizing the apparatus, which has been described with reference to FIG. 1, FIG. 2 and FIGS. 3A and 3B, will next be described with reference to FIGS. 4A and 4B and FIGS. 5 to 11. A step of sticking a guide member in the filter insertion method in accordance with this embodiment is illustrated in FIGS. 4A and 4B, wherein a plan view is shown in FIG. 4A and a side view is shown in FIG. 4B. FIG. 5 is a perspective view showing a step of forming a groove in the filter insertion method in accordance with this embodiment, and FIG. 6 shows a side view of a substrate obtained by the groove forming step shown in FIG. 5. FIG. 7 is a plan view showing a step of positioning a substrate in the filter insertion method in accordance with this embodiment. FIGS. 8 to 11 are sectional views showing steps of inserting a filter in the filter insertion method in accordance with this embodiment.

First, a guide member 33 (quartz substrate, for instance) of about 0.1 mm thick is stuck onto a substrate 30 having a waveguide 31 (PLC module, for instance), with the center aligned with the filter insertion position 32, with an adhesive (ultraviolet-curing resin, for instance), as shown in FIGS. 4A and 4B.

Next, a V-shaped channel (reference numeral 36 in FIG. 6) and a filter insertion groove of 15 µm to 25 µm wide (a reference numeral 37 in FIG. 6) are formed in the filter insertion position 32 of the substrate 30 and guide member 33, as shown in FIG. 5. For instance, a rotary blade 34 with a V-shaped cutting edge is used to form the V-shaped channel 36 while a rotary blade 35 is used to form the filter insertion groove 37, for instance. These steps of forming grooves can be completed in a single step if a combination of rotary blades 34 and 35 is used.

Then, the substrate 30 is positioned on a table by bringing the edges of the substrate 30 into contact with projections (three points) of abutments 40 and 41 on the table, as shown in FIG. 7.

Figure 8:
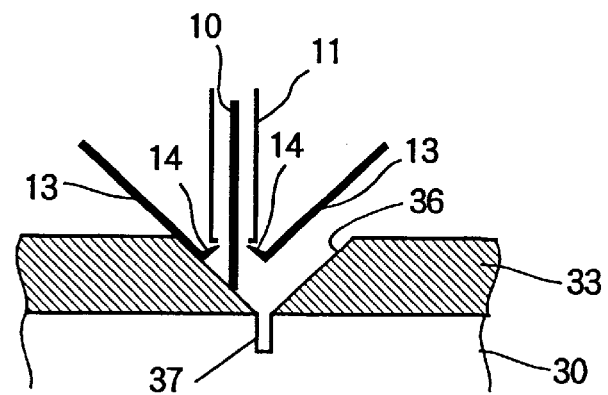
FIG. 8 is a sectional view showing a step 1 for inserting a filter in the method in accordance with the embodiment.
Figure 9:
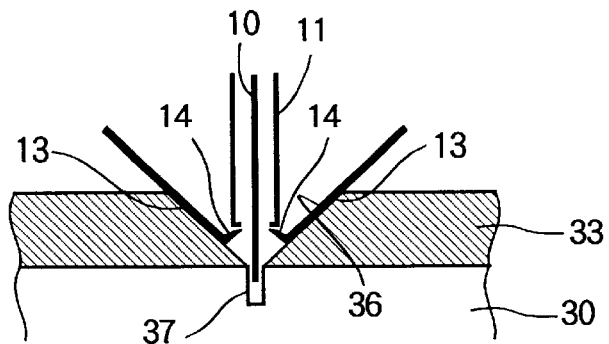
FIG. 9 is a sectional view showing a step 2 for inserting a filter in the method in accordance with the embodiment.

Next, the filter 10 is put out by a given length from the outlet 11b of the guide portion 11 of the apparatus, and the tip of the head portion 1 of the apparatus is pressed against an inclined surface of the V-shaped channel 36, as shown in FIG. 8. When the tip of the head portion 1 of the apparatus is pressed against the inclined surface of the V-shaped channel 36, the head portion 1 of the apparatus moves along the supporting bars (a reference numeral 22 in FIG. 1), expanding and contracting the springs (a reference numeral 23 in FIG. 1). Then, the tips of the plate members 13 in the head portion 1 of the apparatus come into contact with both inclined surfaces of the V-shaped channel 36, as shown in FIG. 9.

Figure 10:
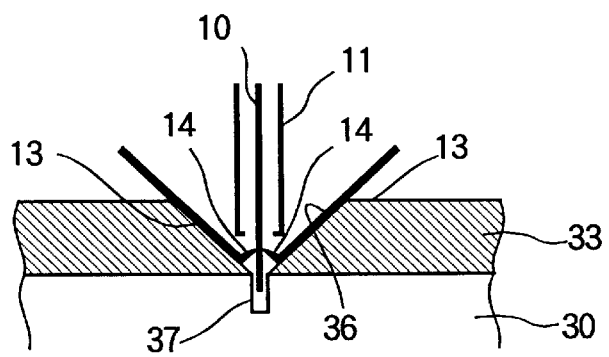
FIG. 10 is a sectional view showing a step 3 for inserting a filter in the method in accordance with the embodiment.

When the apparatus is pressed further toward the V-shaped channel 36, the plate members 13 are pressed by the inclined surfaces of the V-shaped channel 36, which narrows the space between the tips 13a of the plate members 13, narrowing the space between the edges of the blades 14, as shown in FIG. 10, and cutting the filter 10 by the blades 14. Then, the cut portion of the filter 10 falls in the filter insertion groove 37.

Figure 11:
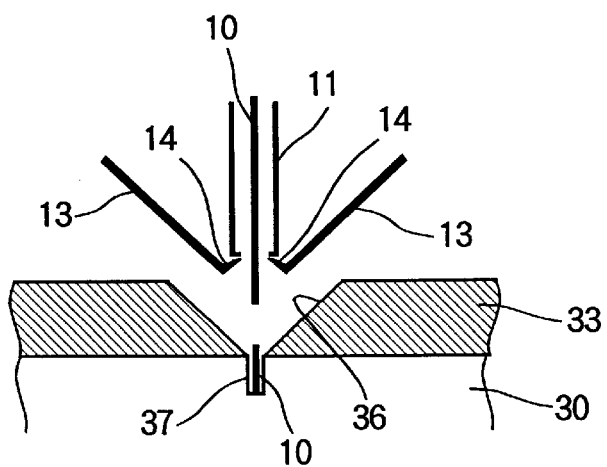
FIG. 11 is a sectional view showing a step 4 for inserting a filter in the method in accordance with the embodiment.

Next, when the head portion 1 of the apparatus is moved off the V-shaped channel 36, as shown in FIG. 11, the space between the tips 13a of the plate members 13 expands as a result of the elastic restoration action of the plate members 13 of the head portion 1, consequently expanding the space between the blades 14 to the original width. After this, the rollers 12 for feeding the filter are rotated to deliver the filter 10 for a next filter insertion step. The mechanism for returning the plate members 13 to their original positions may not utilize the elastic restoration power of the plate members 13 themselves, and the mechanism may comprise an elastic member such as a spring disposed between the pair of plate members 13 for widening them apart.

If the filter insertion method of this embodiment (or the apparatus of this embodiment) is used, as described above, a filter can be quickly inserted into a filter insertion groove through simple operations, without using conventional expensive apparatus utilizing a camera and a laser measuring machine.

The invention being thus described, it will be obvious that the same may be varied in many ways. Such variations are not to be regarded as a departure from the spirit and scope of the invention, and all such modifications as would be obvious to one skilled in the art are intended to be included within the scope of following claims.

What is claimed is:

1. An apparatus for inserting a filter into a groove formed in a substrate, comprising:

a head portion which holds a strip of filter; and a support portion which supports said head portion;

wherein said head portion includes:

a guide portion which has an outlet through which said filter is fed, and which guides said filter toward said outlet;

a pair of plate members which are disposed on both sides of said guide portion to surround said guide portion, with a space left between tips of said plate members and with vicinities of said tips provided at a given angle; and a pair of blades which are disposed on said tips of said plate members, edges of said blades facing each other with a space wider than thickness of said filter;

said apparatus being configured in such a manner that when said head portion is pressed against a V-shaped channel comprising a pair of inclined surfaces by said support portion, with said vicinities of said tips of said plate members in face-contact with said inclined surfaces of said V-shaped channel, elastic deformation occurs in said pair of plate members, narrowing said space between said edges of said pair of blades, and when said head portion is moved off said V-shaped channel, said space between said edges of said pair of blades expands to an original width.

2. The apparatus of claim 1, wherein said support portion comprises:

a pair of arms which are disposed on both sides of said head portion;

a supporting bar which is attached to said arms and supports said head portion so that said head portion can be moved in a direction orthogonal to a feeding direction of said filter; and a pair of springs which are disposed on said pair of arms, each spring applying a force to press each face of said head portion facing said arm.

3. The apparatus of claim 2, further comprising:

a thrust bar which supports said support portion in such a manner that said support portion can be rotated about an axis passing a center of said head portion and extending in the feeding direction of said filter; and a thrusting spring which transfers to said support portion a force applied to said thrust bar in the feeding direction of said filter.

4. The apparatus of claim 1, wherein said head portion comprises:
- a pair of rollers which move said filter toward said outlet; and
- a driving mechanism for driving said pair of rollers.

5. The apparatus of claim 1, wherein said head portion comprises:
- a path of incoming light which extends at an angle with respect to a surface of said filter and reaches said guide portion;
- a light emitting element which emits light to said filter through said path of incoming light;
- a path of reflected light which extends at an angle with respect to said surface of said filter and reaches said guide portion; and
- a light receiving element for receiving the light which is emitted from said light emitting element and reflected from said filter and passes through said path of reflected light.

6. A method for inserting a filter into a groove formed in a substrate using a filter insertion apparatus;

said apparatus comprising a head portion which holds a strip of filter and a support portion which supports said head portion, said head portion including a guide portion which has an outlet through which said filter is fed and which guides said filter toward said outlet, a pair of plate members which are disposed on both sides of said guide portion to surround said guide portion, with a space left between tips of said plate members and with vicinities of said tips provided at a given angle, and a pair of blades which are disposed on said tips of said plate members, edges of said blades facing each other with a space wider than thickness of said filter;

said method comprising the steps of:
- putting a guide member onto a substrate of optical circuit having an optical waveguide;
- forming a V-shaped channel in said guide member;
- forming a filter insertion groove directly below said V-shaped channel in said substrate of optical circuit;
- putting out said filter by a given length from said outlet of said guide portion of said apparatus;
- inserting said filter put out of said outlet of said guide portion into said filter insertion groove by pressing said apparatus toward said V-shaped channel of said guide member, with vicinities of the tips of the plate members of said apparatus in face-contact with inclined surfaces of said V-shaped channel in said guide member, narrowing space between edges of said pair of blades to cut the filter coming out of said outlet of said guide portion by pressing said apparatus further toward said V-shaped channel in said guide member; and
- moving said head portion off said V-shaped channel in said guide member.

* * * * *

UNITED STATES PATENT AND TRADEMARK OFFICE
CERTIFICATE OF CORRECTION

PATENT NO. : 6,495,766 B2
DATED : December 17, 2002
INVENTOR(S) : Takahashi

It is certified that error appears in the above-identified patent and that said Letters Patent is hereby corrected as shown below:

<u>Title page,</u>
Item [*] Notice, should read :
-- Subject to any disclaimer, the term of this patent is extended or adjusted under 35 U.S.C. 154(b) by 93 days. --

Signed and Sealed this

Tenth Day of August, 2004

JON W. DUDAS
*Acting Director of the United States Patent and Trademark Office*